United States Patent
Song et al.

(10) Patent No.: US 8,994,079 B2
(45) Date of Patent: Mar. 31, 2015

(54) GRAPHENE ELECTRONIC DEVICES HAVING MULTI-LAYERED GATE INSULATING LAYER

(75) Inventors: Hyun-jae Song, Yongin-si (KR); Byung-jin Cho, Daejeon (KR); Sun-ae Seo, Hwaseong-si (KR); Woo-cheol Shin, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 124 days.

(21) Appl. No.: 13/491,999

(22) Filed: Jun. 8, 2012

(65) Prior Publication Data

US 2012/0313079 A1 Dec. 13, 2012

(30) Foreign Application Priority Data

Jun. 10, 2011 (KR) .................. 10-2011-0056341

(51) Int. Cl.
*H01L 29/76* (2006.01)
*H01L 29/778* (2006.01)
*H01L 29/16* (2006.01)
*H01L 29/51* (2006.01)

(52) U.S. Cl.
CPC .......... *H01L 29/778* (2013.01); *H01L 29/1606* (2013.01); *H01L 29/513* (2013.01)
USPC ....................................................... 257/288

(58) Field of Classification Search
CPC ................. H01L 2924/13088; H01L 29/1606
USPC ........................................................ 257/288
See application file for complete search history.

(56) References Cited

U.S. PATENT DOCUMENTS

| | | | |
|---|---|---|---|
| 7,297,621 B2 | 11/2007 | Brandon | |
| 7,368,009 B2 | 5/2008 | Okada et al. | |
| 2004/0061422 A1* | 4/2004 | Avouris et al. ................ | 313/315 |
| 2005/0277234 A1 | 12/2005 | Brandon | |
| 2009/0140801 A1 | 6/2009 | Ozyilmaz et al. | |
| 2010/0065826 A1 | 3/2010 | Takimiya et al. | |
| 2010/0214012 A1 | 8/2010 | Raza | |
| 2011/0017979 A1 | 1/2011 | Meric et al. | |
| 2011/0042649 A1 | 2/2011 | Duvall et al. | |
| 2011/0124138 A1 | 5/2011 | Takahara | |
| 2011/0143101 A1 | 6/2011 | Sandhu | |
| 2011/0291068 A1* | 12/2011 | Kobayashi ........................ | 257/9 |
| 2012/0080658 A1* | 4/2012 | Yang et al. ........................ | 257/9 |

FOREIGN PATENT DOCUMENTS

| | | | |
|---|---|---|---|
| JP | 2008-205272 A | 9/2008 | |
| JP | 2009-164432 A | 7/2009 | |

(Continued)

OTHER PUBLICATIONS

R. Wang et al. "Control of Carrier Type and Density in Exfoliated Graphene by Interface Engineering"; ACS Nano, vol. 5, p. 408-412; 2011.

(Continued)

*Primary Examiner* — Yu-Hsi D Sun
(74) *Attorney, Agent, or Firm* — Harness, Dickey & Pierce, P.L.C.

(57) ABSTRACT

A graphene electronic device includes a multi-layered gate insulating layer between a graphene channel layer and a gate electrode. The multi-layered gate insulating layer includes an organic insulating layer and an inorganic insulating layer on the organic insulating layer.

17 Claims, 5 Drawing Sheets

(56) References Cited

FOREIGN PATENT DOCUMENTS

| JP | 2009-277803 A | 11/2009 |
|----|---------------|---------|
| JP | 2010-206176 A | 9/2010 |
| KR | 20010050055 A | 6/2001 |
| KR | 2009-0132874 A | 12/2009 |
| KR | 20100111999 A | 10/2010 |

OTHER PUBLICATIONS

C. R. Dean et al. "Boron nitride substrates for high-quality graphene electronics"; Nature Nanotechnology, vol. 5, p. 722-726; 2010.

Z. Liu et al. "Large-Scale Graphene Transistors with Enhanced Performance and Reliability Based on Interface Engineering by Phenylsilane Self-Assembled Monolayers"; Nano Letters, vol. 11, p. 523-528; 2011.

H. Wang et al. "Hysteresis of Electronic Transport in Graphene Transistors"; ACS Nano, vol. 4, p. 7221-7228; 2010.

K. I. Bolotin et al. "Ultrahigh electron mobility in suspended graphene"; Solid State Communications, vol. 146, p. 351-355; 2008.

Lafkioti et al., "Graphene on a Hydrophobic Substrate: Doping Reduction and Hysteresis Suppression under Ambient Conditions", Nano Letters, vol. 10, p. 1149-1153; 2010; Received for review: Sep. 24, 2009, Published on Web: Mar. 10, 2010.

* cited by examiner

GRAPHENE ELECTRONIC DEVICES HAVING MULTI-LAYERED GATE INSULATING LAYER

CROSS-REFERENCE TO RELATED APPLICATIONS

This application claims the benefit of Korean Patent Application No. 10-2011-0056341, filed on Jun. 10, 2011, in the Korean Intellectual Property Office, the disclosure of which is incorporated herein in its entirety by reference.

BACKGROUND

1. Field

Some example embodiments relate to graphene electronic devices having improved electrical characteristics by forming a multi-layered gate insulating layer between a graphene channel layer and a gate electrode.

2. Description of the Related Art

Graphene having a 2-dimensional hexagonal carbon structure is a new material that may replace semiconductors. Graphene is a zero gap semiconductor and has a mobility of 100,000 $cm^2V^{-1}s^{-1}$ at room temperature, which is approximately 100 times higher than that of silicon. Thus, graphene may be applied to high frequency devices such as radio frequency (RF) devices.

When a graphene nano-ribbon (GNR) having a graphene channel width of 10 nm or less is formed, a band gap is formed by a size effect. A field effect transistor that may be operated at room temperature may be manufactured by using the GNR.

Graphene electronic devices are electronic devices that include graphene, such as field effect transistors or RF transistors. When in a floating state in an air atmosphere, graphene has a relatively high mobility without contacting any other material. However, the mobility may be reduced when graphene contacts an inorganic insulating layer such as silicon oxide or when graphene absorbs moisture.

SUMMARY

Some example embodiments provide graphene electronic devices having a hydrophobic organic insulating layer between a graphene channel layer and a gate insulating layer.

Additional aspects will be set forth in part in the description which follows and, in part, will be apparent from the description, or may be learned by practice of the presented embodiments.

According to an example embodiment, a graphene electronic device includes a conductive substrate, a gate insulating layer, a graphene channel layer, a source electrode and a drain electrode. The conductive substrate is configured to function as a gate electrode. The gate insulating layer is formed on the conductive substrate. The graphene channel layer is formed on the gate insulating layer. The source electrode is formed one end of the graphene channel layer, and the drain electrode is formed on another end of the graphene channel layer. The gate insulating layer includes an inorganic insulating layer and an organic insulating layer.

The organic insulating layer may be disposed between the inorganic insulating layer and the graphene channel layer. The organic insulating layer may include a fluorine group polymer. The fluorine group polymer may be one selected from a group consisting of polyvinylfluoride (PVF), polyvinylidene fluoride (PVDF), poly(perfluorobutenylvinylether), polytetrafluoroethylene (PTFE), and an amorphous fluoropolymer.

The organic insulating layer may have a thickness smaller than that of the inorganic insulating layer. The organic insulating layer may have a thickness in a range from about 1 nm to about 20 nm.

The inorganic insulating layer may be formed of one material selected from the group consisting of a silicon oxide, an aluminum oxide, and a hafnium oxide.

The graphene channel layer may include single-layer graphene or bi-layer graphene. The graphene channel layer may be a nano-ribbon graphene channel layer, and the graphene electronic device may be a field effect transistor. The graphene electronic device may further include a passivation layer covering the graphene channel layer.

According to another example embodiment, a graphene electronic device includes a substrate, a graphene channel layer, a source electrode, a drain electrode, a gate insulating layer, and a gate electrode. The graphene channel layer may be formed on the substrate. The source electrode may be formed on one end of the graphene channel layer, and the drain electrode may be formed on another end of the graphene channel layer. The gate insulating layer may be formed to cover the graphene channel layer between the source electrode and the drain electrode. A gate electrode may be formed on the gate insulating layer between the source electrode and the drain electrode. The gate insulating layer may include an organic insulating layer and an inorganic insulating layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Reference will now be made in detail to embodiments, examples of which are illustrated in the accompanying drawings. In the drawings, lengths and sizes of layers and regions may be exaggerated for clarity, and also, like reference numerals refer to the like elements throughout and descriptions thereof will be omitted.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
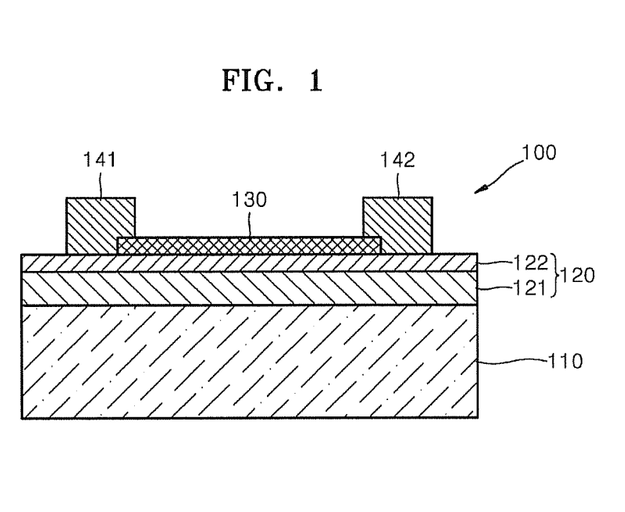
FIG. 1 is a schematic cross-sectional view showing a structure of a graphene electronic device according to an example embodiment.

FIG. 1 is a schematic cross-sectional view showing a structure of a graphene electronic device 100 according to an example embodiment.

Referring to FIG. 1, a multi-layered gate insulating layer 120 may be formed on a substrate 110 and a graphene channel layer 130 may be formed on the multi-layered gate insulating layer 120. A source electrode 141 and a drain electrode 142 may be respectively formed on both ends of the graphene channel layer 130.

The substrate 110 may function as a bottom gate electrode, and may be formed of a highly doped material such as silicon, tantalum nitride, gold, aluminum, indium tin oxide, etc. The multi-layered gate insulating layer 120 may include an inorganic insulating layer 121 on the substrate 110 and an organic insulating layer 122 on the inorganic insulating layer 121. The inorganic insulating layer 121 may have a thickness in a range from about 100 nm to about 300 nm. The inorganic insulating layer 121 may be formed of a silicon oxide, an aluminum oxide, a hafnium oxide, etc.

The organic insulating layer 122 prevents or reduces the presence of a foreign material at an interface between the inorganic insulating layer 121 and the graphene channel layer 130, and may be formed of a polymer insulating layer having a strong hydrophobic characteristic in order to prevent or reduce the absorption of water molecules that cause hole doping in the graphene channel layer 130.

The organic insulating layer 122 may be formed to be thinner than the inorganic insulating layer 121. The organic insulating layer 122 may be formed to have a thickness in a range from about 1 nm to about 20 nm by using a spin coating method or a deposition method. If the organic insulating layer 122 has a thickness less than 1 nm, the graphene channel layer 130 may not be entirely covered. If the organic insulating layer 122 has a thickness greater than 20 nm, a gate voltage may be increased.

The organic insulating layer 122 may be formed of a fluorine group polymer or a self-assembled monolayer. The fluorine group polymer may be polyvinylfluoride (PVF), polyvinylidene fluoride (PVDF), poly(perfluorobutenylvinylether), polytetrafluoroethylene (PTFE), and an amorphous fluoropolymer such as Nafion® (a product of Dupont), CYTOP® (a product of Asahi Glass), etc.

The graphene channel layer 130 may be formed by transferring graphene on the organic insulating layer 122 that is exfoliated from graphite, or by a chemical vapor deposition (CVD) method and patterning the graphene. The graphene channel layer 130 may include single-layer graphene or bi-layer graphene.

The source electrode 141 and the drain electrode 142 may be formed of a metal that may realize an ohmic contact with the graphene channel layer 130. The source electrode 141 and the drain electrode 142 may be formed in a double-layered metal layer such as Cr/Au, Ti/Au, or Pd/Au.

The graphene electronic device of FIG. 1 is a bottom gate type transistor. When the graphene channel layer 130 having a width in a range from about 1 nm to about 20 nm is formed, the graphene channel layer 130 may have a semiconductor characteristic so that a band gap is formed by a size-effect. Accordingly, the graphene electronic device of FIG. 1 is a field effect transistor (FET). A FET that uses graphene as a channel may be operated at room temperature.

When the graphene channel layer 130 having a width greater than about 100 nm is formed, the graphene channel layer 130 may be a conductor and may have a carrier mobility of 100,000 cm$^2$V$^{-1}$s$^{-1}$ at room temperature, which is approximately 100 times higher than that of silicon. A graphene electronic device having the graphene channel layer 130 may be an RF transistor.

Figure 2:
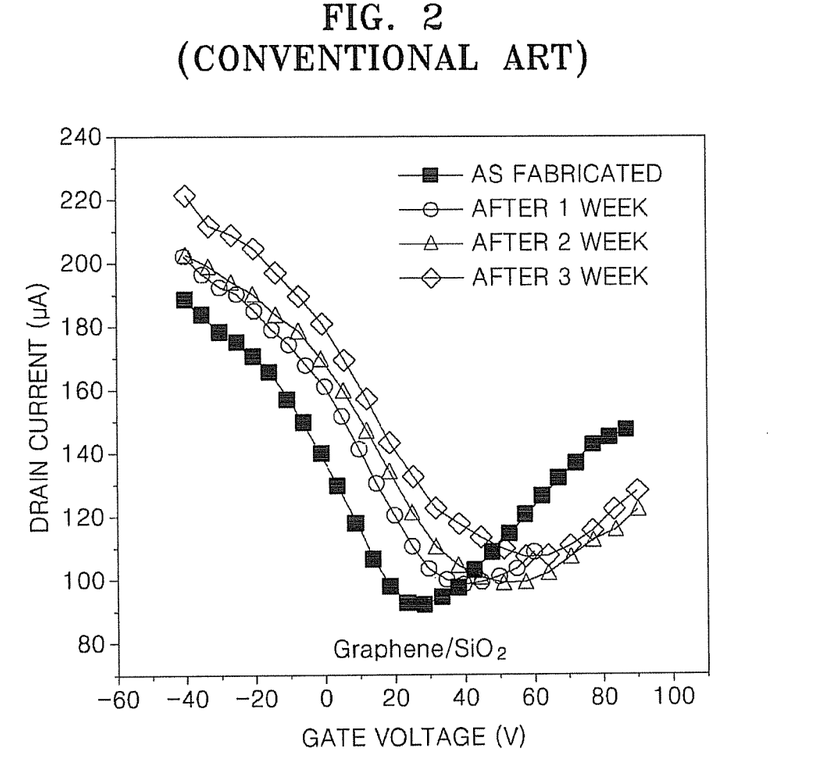
FIG. 2 is a graph showing drain current characteristics according to a gate voltage of a field effect transistor (FET) in which a gate insulating layer is formed of only an inorganic insulating layer in the structure of FIG. 1.
Figure 3:
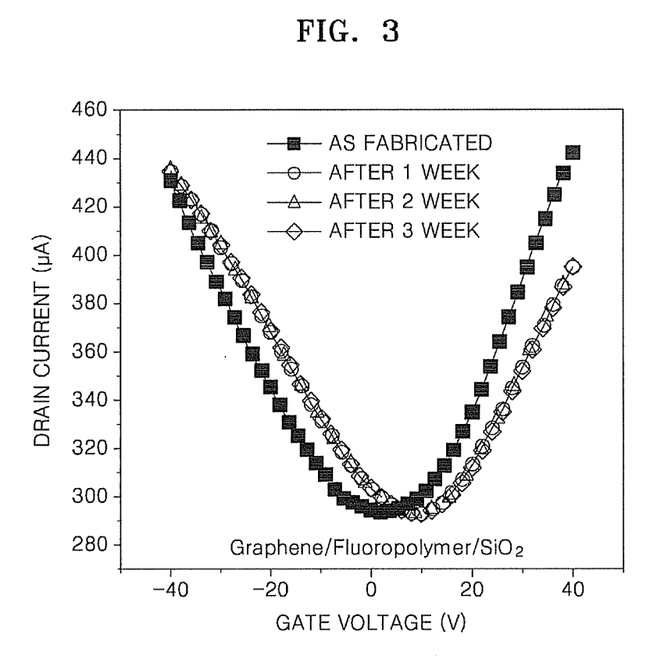
FIG. 3 is a graph showing drain current characteristics according to a gate voltage of a FET having the structure of FIG. 1.

FIG. 2 is a graph showing drain current characteristics according to a gate voltage of a FET (hereinafter, a conventional graphene FET) in which the multi-layered gate insulating layer 120 is formed of only the inorganic insulating layer 121 in the structure of FIG. 1. FIG. 3 is a graph showing drain current characteristics according to a gate voltage of a FET (hereinafter, a graphene FET of an example embodiment) having the structure of FIG. 1.

The graphene FETs of FIGS. 2 and 3 are formed of the inorganic (SiO$_2$) insulating layer 121 having a thickness of 100 nm formed on a Si substrate, and the organic insulating layer 122 of FIG. 3 is formed of poly(perfluorobutenylvinylether) which is a fluorine group polymer having a thickness of 7 nm. The graphene channel layer 130 is formed of graphene exfoliated from graphite, and the source electrode 141 and the drain electrode 142 may be respectively deposited to have 5 nm thicknesses of Cr layer and 100 nm thickness of Au layer on the Cr layer. Variations of electrical characteristics of the graphene FETs due to hole doping formed by absorbing moisture present in the air are measured by exposing the manufactured graphene FETs. A relative humidity of air was maintained at 45%.

Referring to FIG. 2, the conventional graphene FET has a Dirac voltage V$_{Dirac}$ of approximately 26.7 V as fabricated, and as time lapses, the Dirac voltage V$_{Dirac}$ changes due to hole doping. The Dirac voltage V$_{Dirac}$ refers to a point where the conductivity of graphene is at a minimum state, and also denotes a point where the graphene has charge-neutrality. When the graphene is not doped, the Dirac voltage V$_{Dirac}$ may be positioned at 0 V.

Referring to FIG. 3, the graphene FET of an example embodiment as fabricated has a Dirac voltage V$_{Dirac}$ of approximately 0 V. Accordingly, it is confirmed that, in the graphene FET of an example embodiment, the charge-neutrality of the graphene is stably maintained because chemical impurities that cause hole doping in the graphene are remarkably reduced by the fluorine group polymer.

Also, it is confirmed that although the exposure time in air is increased, the variation of the Dirac voltage V$_{Dirac}$ in the graphene FET of an example embodiment is relatively small. When graphene is formed on a fluorine group polymer having a relatively strong hydrophobic characteristic and a relatively low moisture permeability, the absorption of $H_2O$ molecules that cause hole doping in the graphene may be significantly reduced.

Figure 4:
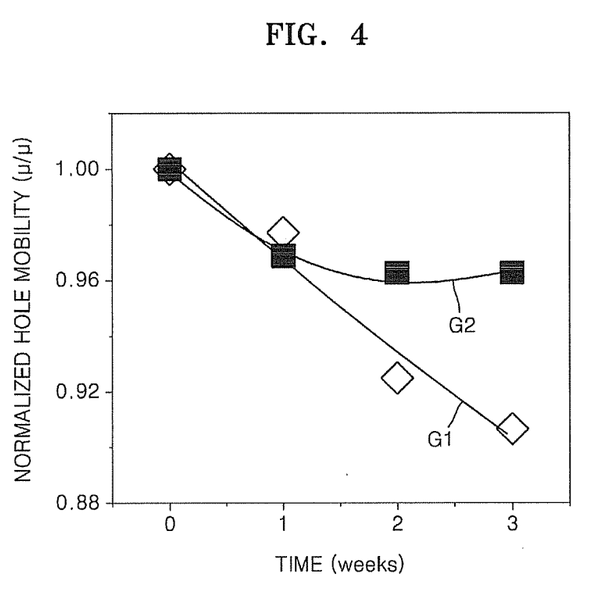
FIG. 4 is a graph showing variations of hole mobility according to the increase in exposure time in air of a conventional graphene FET and a graphene FET according to an example embodiment.

FIG. 4 is a graph showing variations of hole mobility according to the increase in the exposure time in air of an conventional graphene FET and a graphene FET of an example embodiment. The conventional graphene FET (graph G1) shows a continual increase in the hole doping concentration as time elapses; however, the graphene FET of an example embodiment (graph G2) shows a decrease of the hole mobility of less than 4% although the graphene FET of an example embodiment was exposed to air for three weeks. In the graphene FET of an example embodiment, a structure in which a fluorine group polymer contacts graphene inhibits hole doping that may be caused by moisture. Thus, the charge-neutrality of the graphene is maintained and, at the same time, the hole mobility is also stably maintained.

Figure 5:
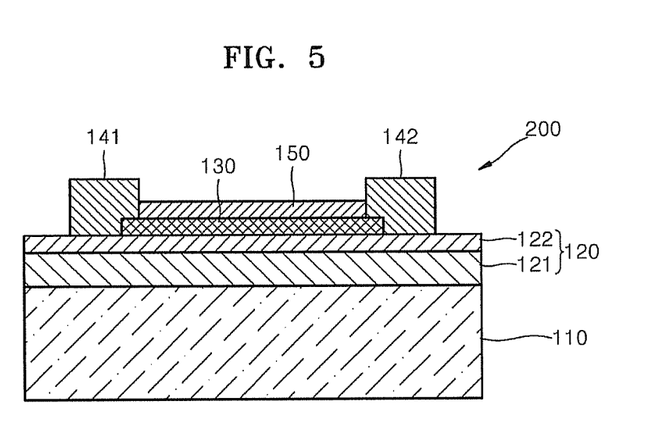
FIG. 5 is a schematic cross-sectional view of a structure of a graphene electronic device according to another example embodiment.

FIG. 5 is a schematic cross-sectional view of a structure of a graphene electronic device 200 according to another example embodiment. Like reference numerals are used to indicate elements that are substantially identical to the elements of FIGS. 1 and 5, and thus, the detailed description thereof will not be repeated.

Referring to FIG. 5, a passivation layer 150 may be further formed on the graphene channel layer 130. The passivation layer 150 prevents or reduces the graphene channel layer 130 from contacting oxygen and moisture in air. The passivation layer 150 may be formed to a thickness in a range from about 5 nm to about 30 nm using a silicon oxide.

Figure 6:
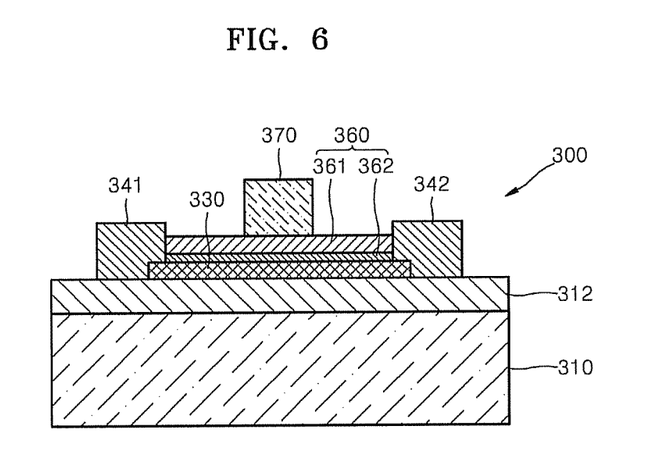
FIG. 6 is a schematic cross-sectional view of a structure of a graphene electronic device according to still another example embodiment.

FIG. 6 is a schematic cross-sectional view of a structure of a graphene electronic device 300 according to still another example embodiment. Referring to FIG. 6, an insulating layer 312 may be formed on a substrate 310. If the substrate 310 is an insulating substrate, the insulating layer 312 may be omitted. A graphene channel layer 330 may be formed on the insulating layer 312, and a source electrode 341 and a drain electrode 342 are respectively formed on both ends of the graphene channel layer 330. A multi-layered gate insulating layer 360 is formed on the graphene channel layer 330. A gate electrode 370 is formed on the multi-layered gate insulating layer 360.

The multi-layered gate insulating layer 360 may include an organic insulating layer 362 on the graphene channel layer 330 and an inorganic insulating layer 361 on the organic insulating layer 362. The inorganic insulating layer 361 may be formed to have a thickness in a range from about 100 nm to about 300 nm. The inorganic insulating layer 361 may be formed of a silicon oxide, an aluminum oxide, a hafnium oxide, etc.

The organic insulating layer 362 prevents or reduces the presence of a foreign material at an interface between the inorganic insulating layer 361 and the graphene channel layer 330, and may be formed of a polymer insulating layer having a relatively strong hydrophobic characteristic to prevent or reduce the absorption of water molecules that cause hole doping in the graphene channel layer 330. The organic insulating layer 362 may be formed to be thinner than the inorganic insulating layer 361. The organic insulating layer 362 may be formed to have a thickness in a range from about 1 nm to about 20 nm by using a spin coating method or a deposition method. If the organic insulating layer 362 has a thickness less than 1 nm, the graphene channel layer 330 may not be entirely covered. If the organic insulating layer 362 has a thickness greater than 20 nm, a gate voltage may be increased.

The organic insulating layer 362 may be formed of a fluorine group polymer or a self-assembled monolayer. The fluorine group polymer may be polyvinylfluoride (PVF), polyvinylidene fluoride (PVDF), poly(perfluorobutenylvinylether), polytetrafluoroethylene (PTFE), and an amorphous fluoropolymer such as Nafion® (a product of Dupont), CYTOP® (a product of Asahi Glass), etc.

The graphene channel layer 330 may be formed by transferring graphene on the organic insulating layer 362 that is exfoliated from graphite, or may be formed by a chemical vapor deposition (CVD) method, and patterning the graphene. The graphene channel layer 330 may include single-layer graphene or bi-layer graphene.

The source electrode 341 and the drain electrode 342 may be formed of a metal that may bring an ohmic contact with the graphene channel layer 330. The source electrode 341 and the drain electrode 342 may be formed in a double-layered metal layer such as Cr/Au, Ti/Au, or Pd/Au. The gate electrode 370 may be formed of polysilicon or an ordinary metal such as aluminum. The transistor of FIG. 6 is a top gate type transistor.

When the graphene channel layer 330 having a width in a range from about 1 nm to about 20 nm is formed, the graphene channel layer 330 may have a semiconductor characteristic so that a band gap is formed by a size-effect. Accordingly, the graphene electronic device of FIG. 6 is a FET. A FET that uses graphene as a channel may be operated at room temperature.

When the graphene channel layer 330 having a width of approximately greater than 100 nm is formed, the graphene channel layer 330 may be a conductor and may have a carrier mobility of 100,000 $cm^2V^{-1}s^{-1}$ at room temperature, which is approximately 100 times higher than that of ordinary silicon. A graphene electronic device having the graphene channel layer 330 may be an RF transistor. An operation of the graphene electronic device 300 of FIG. 6 is substantially the same as the operation of the graphene electronic device of FIGS. 1 through 5, and thus, a detailed description thereof will not be repeated.

In the graphene electronic device having a multi-layered gate insulating layer according to an example embodiment, an organic insulating layer is formed between a graphene channel layer and an inorganic insulating layer. Therefore, the reduction of carrier mobility of the graphene channel layer due to the absorption of oxygen and moisture in air is prevented or reduced. Also, the variation of the Dirac voltage according to the lapse of time is relatively low.

While the present inventive concepts have been particularly shown and described with reference to example embodiments thereof, it will be understood by those of ordinary skill in the art that various changes in form and details may be made therein without departing from the spirit and scope of the following claims.

What is claimed is:

1. A graphene electronic device comprising:
   a conductive substrate configured to function as a gate electrode;
   a gate insulating layer formed on the conductive substrate, the gate insulating layer including an inorganic insulating layer and an organic insulating layer;
   a graphene channel layer formed on the gate insulating layer; and
   a source electrode formed on one end of the graphene channel layer and a drain electrode formed on another end of the graphene channel layer,
   wherein the organic insulating layer includes a fluorine group polymer.

2. The graphene electronic device of claim 1, wherein the organic insulating layer is disposed between the inorganic insulating layer and the graphene channel layer.

3. The graphene electronic device of claim 1, wherein the fluorine group polymer is one selected from a group consisting of polyvinylfluoride (PVF), polyvinylidene fluoride (PVDF), poly(perfluorobutenylvinylether), polytetrafluoroethylene (PTFE), and an amorphous fluoropolymer.

4. The graphene electronic device of claim 1, wherein the organic insulating layer has a thickness smaller than that of the inorganic insulating layer.

5. The graphene electronic device of claim 1, wherein the organic insulating layer has a thickness in a range from about 1 nm to about 20 nm.

6. The graphene electronic device of claim 1, wherein the inorganic insulating layer is formed of one material selected from a group consisting of a silicon oxide, an aluminum oxide, and a hafnium oxide.

7. The graphene electronic device of claim 1, wherein the graphene channel layer includes one of single-layer graphene and bi-layer graphene.

8. The graphene electronic device of claim 1, wherein the graphene channel layer is a nano-ribbon graphene channel layer, and the graphene electronic device is a field effect transistor.

9. The graphene electronic device of claim 1, further comprising:
a passivation layer configured to cover the graphene channel layer.

10. A graphene electronic device comprising:
a graphene channel layer formed on a substrate;
a source electrode formed on one end of the graphene channel layer and a drain electrode formed on another end of the graphene channel layer;
a gate insulating layer formed to cover the graphene channel layer between the source electrode and the drain electrode, the gate insulating layer including an organic insulating layer and an inorganic insulating layer; and
a gate electrode formed on the gate insulating layer between the source electrode and the drain electrode,
wherein the organic insulating layer includes a fluorine group polymer.

11. The graphene electronic device of claim 10, wherein the organic insulating layer is formed between the inorganic insulating layer and the graphene channel layer.

12. The graphene electronic device of claim 10, wherein the fluorine group polymer is one selected from a group consisting of polyvinylfluoride (PVF), polyvinylidene fluoride (PVDF), poly(perfluorobutenylvinylether), polytetrafluoroethylene (PTFE), and an amorphous fluoropolymer.

13. The graphene electronic device of claim 10, wherein the organic insulating layer has a thickness smaller than that of the inorganic insulating layer.

14. The graphene electronic device of claim 10, wherein the organic insulating layer has a thickness in a range from about 1 nm to about 20 nm.

15. The graphene electronic device of claim 10, wherein the inorganic insulating layer is formed of one material selected from a group consisting of a silicon oxide, an aluminum oxide, and a hafnium oxide.

16. The graphene electronic device of claim 10, wherein the graphene channel layer includes one of a single-layer graphene and a bi-layer graphene.

17. The graphene electronic device of claim 10, wherein the graphene channel layer is a nano-ribbon graphene channel layer, and the graphene electronic device is a field effect transistor.

* * * * *